United States Patent [19]
Jacksen

[11] Patent Number: 5,406,065
[45] Date of Patent: Apr. 11, 1995

[54] LINEAR PHOTOELECTRIC ARRAY WITH OPTICAL GAIN

[75] Inventor: Niels F. Jacksen, Maricopa, Ariz.

[73] Assignee: Litton Systems, Inc., Woodland Hills, Calif.

[21] Appl. No.: 58,489

[22] Filed: May 6, 1993

[51] Int. Cl.⁶ .............................................. H01J 40/14
[52] U.S. Cl. .................................. 250/208.1; 250/216
[58] Field of Search ............... 250/208.1, 216, 237 R; 359/592, 593

[56] References Cited

U.S. PATENT DOCUMENTS 3,581,100  5/1971  Milford .............................. 250/216
5,210,400  5/1993  Usami .............................. 250/208.1

*Primary Examiner*—David C. Nelms
*Attorney, Agent, or Firm*—Poms, Smith, Lande & Rose

[57] ABSTRACT

A linear photoelectric array includes plural photoelectric elements and an optical gain element which improves the performance of the array. An optical fiber may be used to define the optical gain element, and apparatus and method of aligning the fine-dimension optical fiber with the linear array of photoelectric elements are disclosed. Materials which are particularly useful for practicing the invention are set forth.

29 Claims, 3 Drawing Sheets

LINEAR PHOTOELECTRIC ARRAY WITH OPTICAL GAIN

BACKGROUND OF THE INVENTION

1. Field of the Invention

The present invention relates to a linear photoelectric array with optical gain. More particularly, the present invention relates to a infrared linear photoconductive optical array using plural low-cost Lead salt (PbSe) detectors or image elements with a linear optical gain element increasing both the detectivity and responsivity of the array.

2. Discussion of the Related Technology

Linear photoelectric arrays are used for a variety of purposes. For example, such arrays may be used in optical measurement devices. In such a use the image or shadow of an object being measured is projected onto the array, and the number of image elements of the array which are illuminated by the image or darkened by the shadow is used as an indication of the physical size of the object. Also, such linear arrays are useful for imaging in which the array is swept across an image field, or in which a scanner provides a line-by-line series of linear image fragments to the array. The photoelectric response of the array converts these linear image fragments into a series of electrical signals which can be used to construct a complete image of the entire scene.

Such linear photoelectric arrays may also be used to image visible or invisible light. For example, such an array may be used to image infrared radiation. Conventional linear arrays which are used to detect infrared radiation generally use detector elements of InSb, or HgCdTe, which are of comparatively high cost. Additionally, these arrays may require that they be cooled to temperatures which are significantly below ambient in order to image infrared radiation with a sufficient level of responsivity and detectivity. These detectors might be cooled to a temperature of 77° K., for example.

The low temperatures required with conventional infrared detectors may require cryogenic fluids or chillers to be used to cool the array, as well as the use of specialized insulation techniques including such precautions as shielding the array from radiant heating. Of course, such cooling and insulation precautions further increase the expense of using such conventional detectors in addition to their already high cost.

Conventionally, rather large unitary (as opposed to array) infrared detectors of Lead Sulfide or Lead Selenide have been provided with optical gain units in the form of hemispherical lens of Silicon, Germanium, or Strontium Titinate. These unitary detectors were not of the small-element type, but were generally of a size about 1 mm square. Such hemispherical concentrating lenses were associated with the infrared detector by the use of an optical cement. The use of the cement, particularly with respect to its thickness, had to be carefully controlled because the cement can cause optical degradation by refractive index mismatch, by defining internal voids which caused light scattering, and by defining reflective interfaces which also cause light scattering, for example. These conventional optical gain units in the form of a hemispherical concentrating lens generally provided a gain factor of about 1.5. They were of no use to increase the detectivity and responsivity of small-element linear array infrared detectors.

The responsivity of an infrared detector is a measure of the output signal level provided by the detector in comparison to the radiated power of the image source with which the detector is associated. The usual unit for responsivity is amps/watt. Similarly, the detectivity of an infrared detector is an indication of the ability of the detector to respond to the long wave length radiations of the infrared portion of the spectrum, also in comparison with the radiated power of the source. The unit of measurement for detectivity is cm. $Hz^{\frac{1}{2}}$/watt.

SUMMARY OF THE INVENTION

In view of the deficiencies of conventional infrared detectors, the present invention has as an object the provision of a low-cost Lead salt infrared linear detector with improved performance.

Further, the present invention has as an object the provision of a linear photoelectric array with an optical gain feature which improves the detectivity, or responsivity, or improves both the detectivity and responsivity of the array.

Accordingly, the present invention provides a photoelectric linear array with a plurality of photoelectric elements disposed adjacent to one another along a line. An optical fiber extends along the line of photoelectric elements and is disposed between the elements and image source. This optical fiber is configured in cross section to define a linear condensing lens providing an elongate linear area of focus. Focusing of light from the image source on the photoelectric elements provides an optical gain improving the performance of the linear array over that which would be possible without the light concentrating optical fiber.

An advantage of the present invention is that it allows an array made with low-cost Lead salt detector elements to achieve a level of performance obtainable previously only with higher cost InSb, or HgCdTe detector elements. Also, the detectivity and responsivity of the array when used at room temperatures to detect infrared radiation are increased to a level equivalent to cooling of the array to about 243° K.. Accordingly, the cooling and insulation requirements of the inventive array may be decreased in some uses as compared with those of the conventional technology.

The above and additional advantages of the present invention will appear from a reading of the following detailed description of a single exemplary preferred embodiment of the invention, taken in conjunction with the following drawing figures.

DESCRIPTION OF THE DRAWING FIGURES

FIG. 1 provides a fragmentary perspective view at a much enlarged scale of a linear photoelectric array embodying the present invention;

FIG. 2 presents a fragmentary plan view also at a much enlarged scale of the photoelectric array as it would appear at an intermediate stage of manufacture;

FIG. 3 is a fragmentary cross sectional view taken at line 3—3 of FIG. 1, and is presented at a further enlarged scale;

FIG. 4 presents a fragmentary perspective view of a manufacturing tool and array component at an intermediate stage of manufacture;

Figure 3:
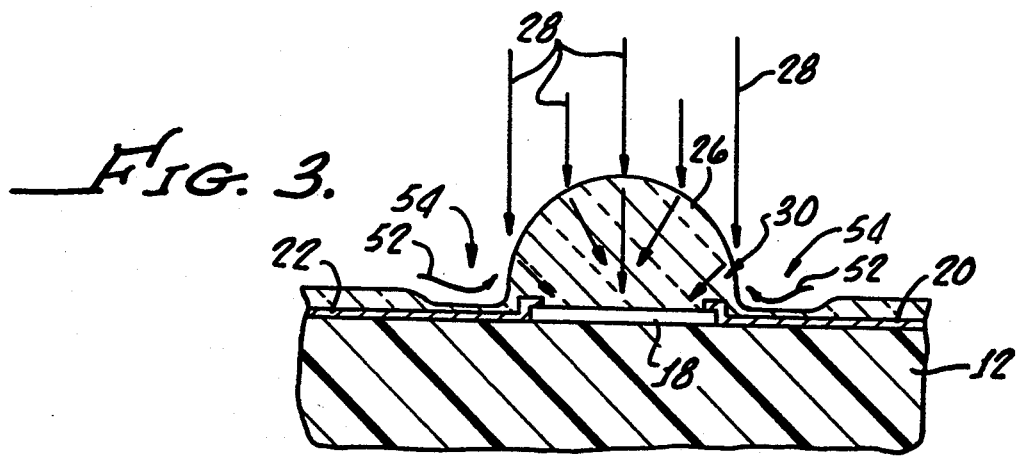
Figure 6:
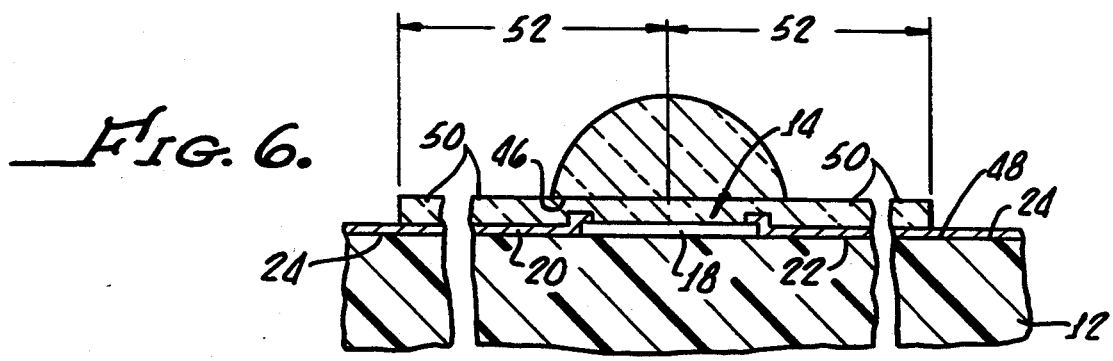
FIG. 6 shows a fragmentary cross sectional view like FIG. 3, but showing components of the array in a preparatory positional relationship at an intermediate stage of manufacture.
Figure 7:
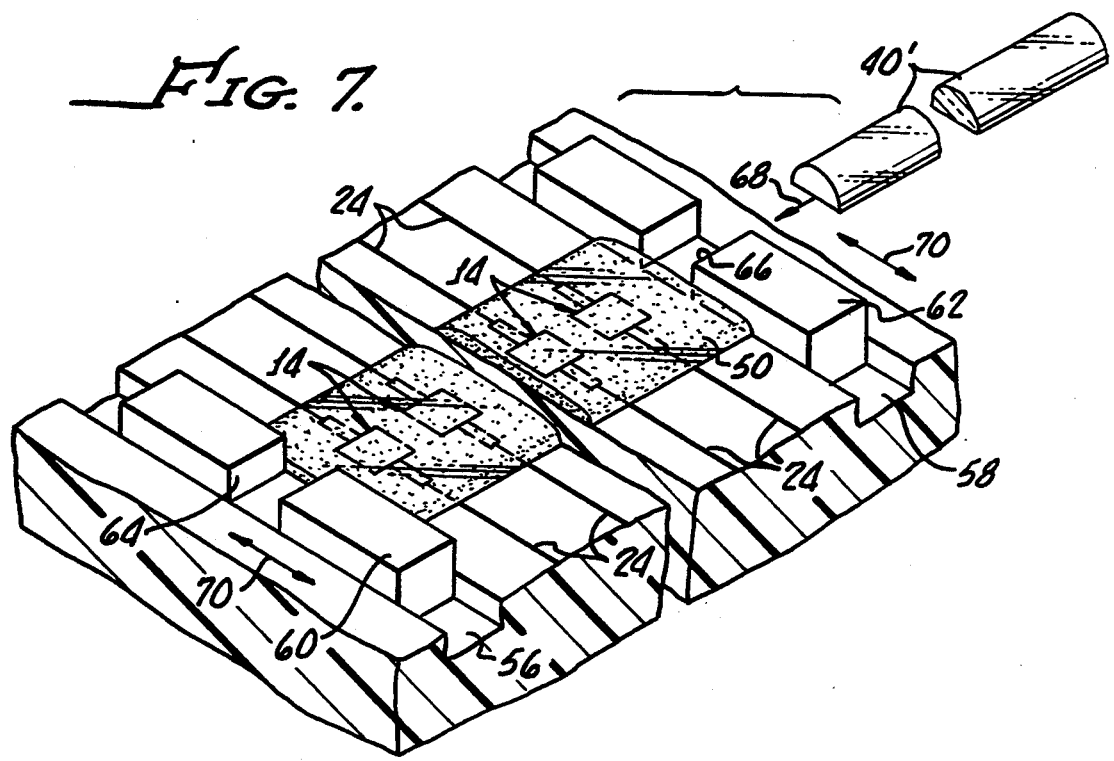
Figure 8:
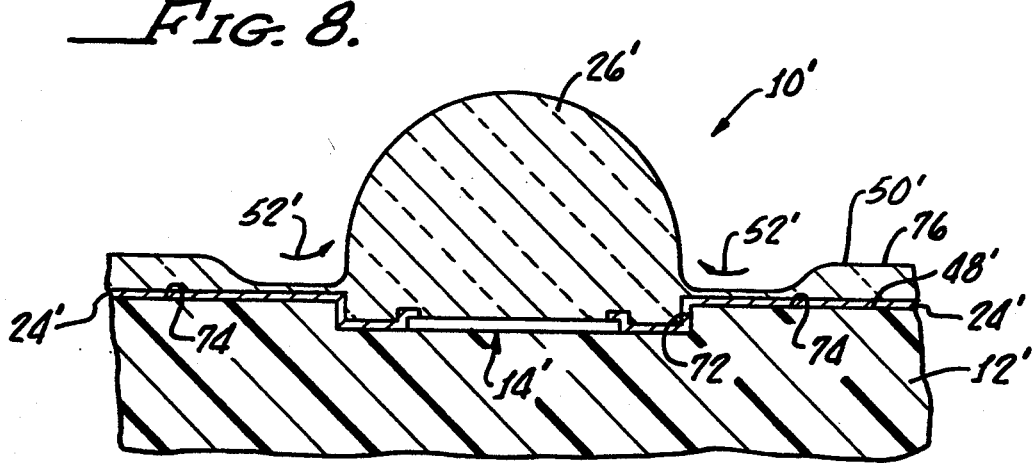

FIG. 7 provides a fragmentary perspective view of an array at an intermediate stage of manufacture prior to the preparatory relationship depicted in FIG. 6;

FIG. 8 is a fragmentary cross sectional view like FIG. 3, but showing an alternative embodiment of the invention.

DETAILED DESCRIPTION OF EXEMPLARY EMBODIMENTS OF THE INVENTION

Figure 1:
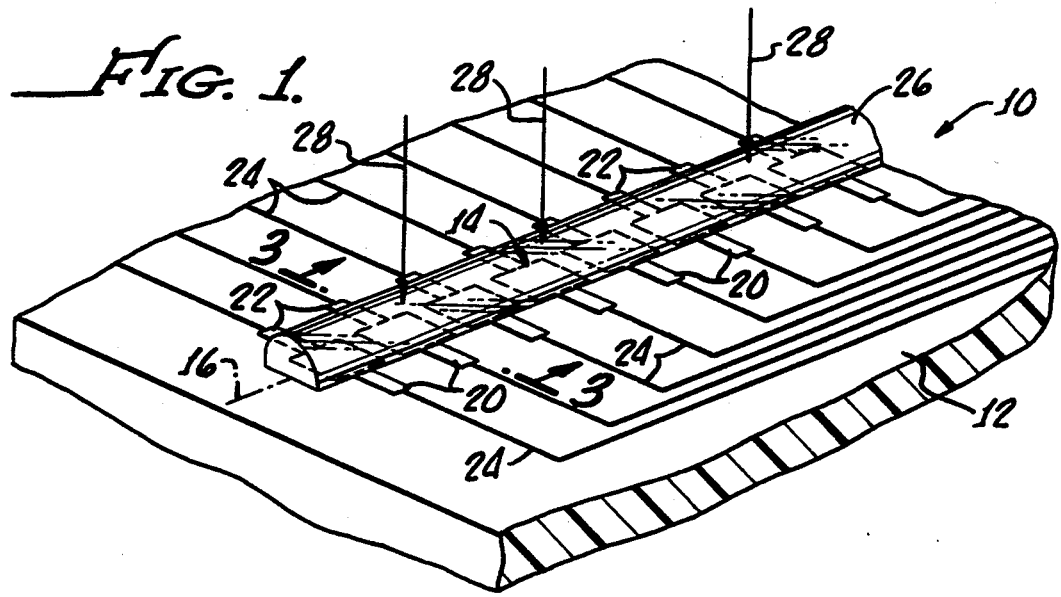
Figure 2:
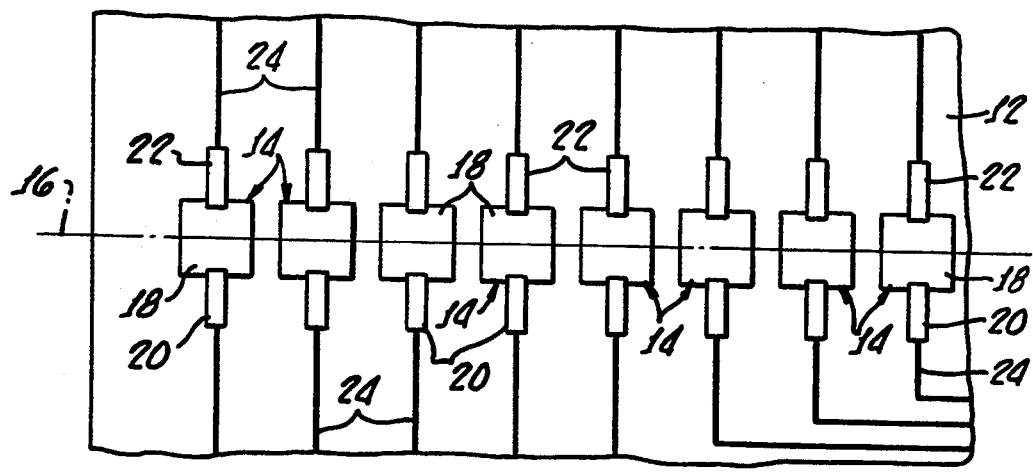

Viewing FIG. 1, a linear infrared array 10 is fragmentarily depicted. The array 10 includes a substrate 12, which may be only a fraction of an inch thick, but which is comparatively thick in relation to the size scale of other features of the array. Viewing FIGS. 1 and 2 in conjunction (the latter Figure showing the array 10 at an intermediate and incomplete stage of manufacture), it is seen that the array 10 includes plural substantially identical and discreet photodetector elements 14. While only a few of the photodetector elements 14 are shown, the array 10 may include as many as several hundred, or more, of the photodetector elements 14. These elements 14 are arranged along and define a line 16, viewing FIG. 2. Thus, the array 10 is a linear array of photodetector elements.

As an example only, and without limitation, the photodetector elements 14 may each be square with a side dimension of about sixty microns (about two and one-half mil), and may be arranged on seventy-five micron (three mil) centers. Each of the photodetector elements 14 includes a pad 18 of Lead Selenide (PbSe). This pad and the other features of the array 10 are formed on the substrate 12 using the photolithographic, thin-film, and other techniques used in the semiconductor art.

From each of the photodetectors 14, a pair of metallic electrical contacts 20, 22 extend outwardly. These contacts 20, 22 of each photodetector 14 respectively connect with individual elongate conductive traces 24 extending across the substrate 12. As will be seen, the traces 24 connect electrical signals originating at the photodetectors 14 externally of the array 10.

FIG. 1 shows that the array 10 also includes an elongate small-scale concentrating or magnifying lens 26. The lens 26 is congruent with the line 16, and extends from end to end of the array of photodetectors 14. This lens 26 is unitary, of a single piece, and is everywhere of the same cross sectional shape, to thereby everywhere provide substantially the same magnification. In order to put the structure illustrated in the drawing Figures into perspective, it should be noted that the lens 26 may be from a fraction of an inch to over an inch in length, about 300 microns (12 mils) in width, and about 150 microns (6 mils) high above the substrate 12.

Viewing FIG. 3, it is seen that the concentrating lens 26 is effective to concentrate incident light rays (represented with arrows 28) on the pad 18 of photoresponsive PbSe material of each photoresponsive element 14 in the linear array 10. The elongate concentrating lens 26 is effective to defining an elongate converging bundle of light rays, which is represented with the numeral 30. The size of the converging bundle 30 of light rays at its incidence on the photodetector element 14 may be on the order of about 20 to 30 microns or less. As might be appreciated considering the small scale of the array 10, fabricating the lens 26, precisely positioning the lens relative to the elements 14, and securing the positioned lens in such a way as to not degrade the optical gain effect resulting from the concentration of the light rays 28, is a considerable challenge. It is believed that if the positioning of the lens 26 relative to the line 16 of the photodetectors 14 is off by more than 15 microns (about three-quarters of a mil), then the optical gain from the lens will not be realized.

Figure 4:
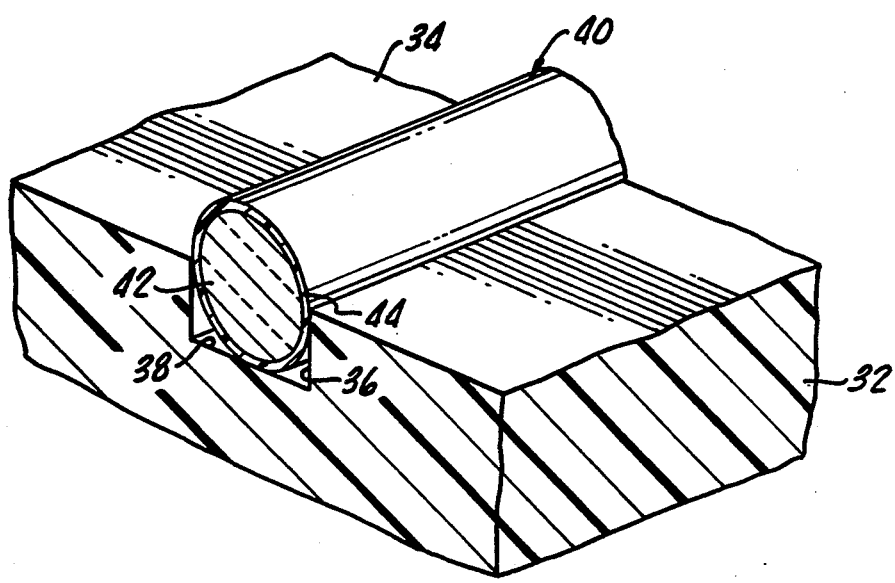

Viewing FIG. 4, a step in the fabrication of the fine-dimension lens 26 is depicted. In order to prepare for fabrication of the lens 26, a fixture 32 is provided with a planar upper surface 34 in which a fine-dimension, straight, elongate groove 36 is defined. The depth of the groove 36 is precisely controlled so that a floor 38 of the groove 36 is disposed uniformly a precisely known distance from the surface 34. In the groove 36, an elongate optical fiber 40 is secured, for example, with the use of an organic temperature-responsive adhesive (not shown). Particularly, a wax adhesive has been found to be satisfactory to secure the optical fiber 40 in the groove 36.

The fiber 40 itself includes a circular core 42 of a material which is especially selected for its transparency to infrared light. For example, the fiber core 42 may be made of a glass of a heavy metal fluoride, or of a Chalcogenide glass. The latter type of glass is particularly preferred, and a glass in this family which is made of Arsenic Selenide has been found to give favorable results in an actual practice of the present invention. The circular elongate core 42 of the fiber 40 will be on the order of 300 microns (12 mils) in diameter. In order to protect the core 42, the fiber 40 is provided with a thin coating 44 of polymer. This coating 44 is about 25 microns thick so that the over all diameter of the fiber 40 is about 350 microns (14 mils). Consequently, the depth of the groove 36 is precisely controlled to about 175 microns (7 mils). This depth for the groove 36 results in about half of the fiber 40 extending above the surface 34. Alternatively, the depth of the groove 36 may be chosen so that more or less than half of the fiber 40 extends above the surface 34.

Figure 5:
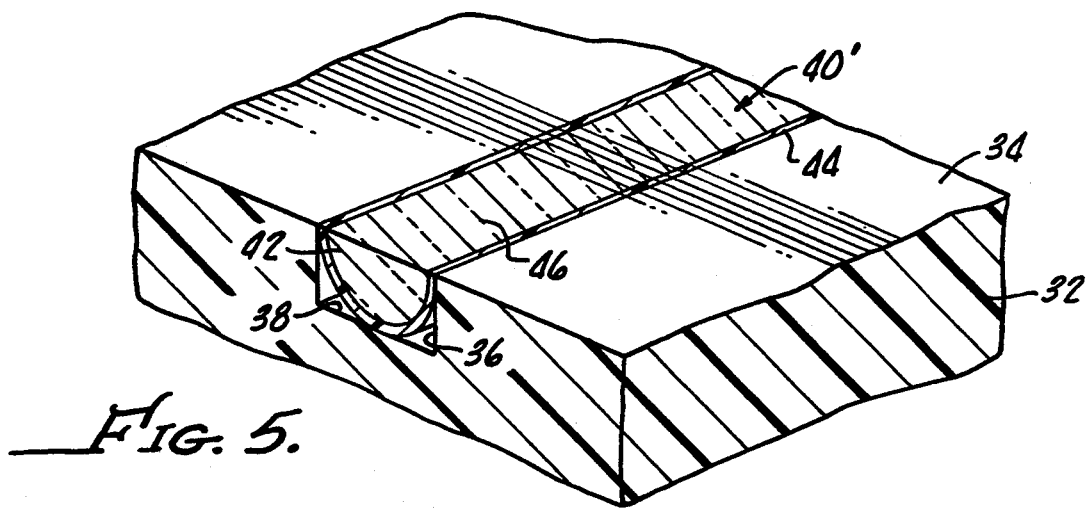
FIG. 5 is a fragmentary perspective view like FIG. 4 showing the manufacturing tool and array component at a subsequent step of manufacture.

With the fiber 40 secured in groove 36 as described, a precision lapping process is carried out to remove the portion of the fiber which extends above the surface 34. As FIG. 5 depicts, the resulting fiber portion 40' has a semicircular cylindrical shape. An elongate surface 46 of the fiber portion 40' is flat and coextensive with the surface 34. Fiber portion 40' is then removed from the groove 36 by heating of the fixture 32 to soften the waxy adhesive which has been used to secure the fiber 40 in groove 36. The remaining polymer coating 44 on fiber portion 40' is removed using Sulfuric acid at a temperature of about 100° C. to strip the polymer.

FIG. 6 shows a cross section of the array 10 at an intermediate stage of manufacture, at which the photodetector elements 14, contacts 20,22, and traces 24 have already been formed on an upper surface 48 the substrate 12. In addition, a thin bonding layer 50 of Arsenic Selenide (As2Se3) has been deposited on the upper surface 48 over the photodetector elements, contacts and traces. This layer 50 of Arsenic Selenide is about 6 microns (one-fourth mil) thick, and extends laterally in each direction a certain distance 52 beyond the center of the photodetectors 14. In FIG. 6, a portion of the lateral extent 52 of the layer 50 is broken out so that the relation of the extent of this layer to the size of the photodetectors 14 is not certain. However, the layer 50 may cover substantially the entire surface 48 if desired. The layer 50 should cover a sufficient extent of the surface 48 to serve as a source of Arsenic Selenide to the lens 26 during a subsequent step of manufacture, as will be explained.

As FIG. 6 depicts, the fiber portion 40' is disposed at its surface 46 upon the layer 50 of Arsenic Selenide and is centered over the photodetector elements 14 along the line 16 of the linear array 10. Subsequently, the array 10 is heated in an oven at about 265° C. for about ten minutes to fuse the Arsenic Selenide layer 50 with the fiber portion 40' in order to form the lens 26. The temperature and time of this oven fusing operation are carefully controlled so as not to liquify the Arsenic Selenide of the fiber portion 40' or of layer 50. However, this material is softened sufficiently to allow a surface tension effect as is described.

As Figure further 3 depicts, the surface tension of the Arsenic Selenide layer 50 during this oven fusing operation causes some material from this layer to flow inwardly toward the lens 26, as is depicted by the arrows 52. Consequently, the lens 26 incorporates some material from the layer 50, while remaining centered over the photodetector elements 14. The result is a slight valley 54 in the layer 50 on each side of the lens 26. Also, the lens 26 takes on its final configuration as an aplanatic hyperhemicylinder. In other words, the lens 26 in cross section is finally of a shape greater than a semicircle over the photodetectors 14.

FIG. 7 depicts an apparatus and method for centering the fiber portion 40' along the line 16 as part of the manufacturing step depicted in FIG. 6, and in preparation for the oven fusing step described above. As FIG. 7 shows, the substrate 12 defines a pair of spaced apart transverse grooves 56, 58, which are each perpendicular to the line 16 of array 10. These grooves are disposed at opposite ends of the line of photodetectors 14, and each slidably receives a respective locating block 60, 62. Each of the locating blocks 60, 62 defines a respective alignment groove 64, 66, which is sized to closely receive the fiber portion 40', as is indicated by the arrow 68.

Because the Arsenic Selenide glass from which the fiber 40 is made is stiff, and the fiber is straight, alignment of the fiber portion 40' with the center of the photodetectors 14 can be effected by slight sliding movements of the blocks 60 and 62, as is indicated by arrow 70. If desires, this alignment step can be conducted while the array 10 is illuminated with infrared radiation, and the output signal from a pair or more of the detectors 14 spaced along the array may be monitored to maximize the optical gain by small fine-tuning position adjustments of the locating blocks 60, 62.

An alternative embodiment of the invention is depicted in FIG. 8. In order to obtain reference numerals for use on FIG. 8, features of this embodiment which are analogous in structure or function to those features introduced above are referenced with the same numeral having a prime added thereto. In the embodiment of the invention depicted in FIG. 8, an array 10' includes a substrate 12', which defines an elongate groove 72 along the line 16' of the photodetectors 14'. On each side of the groove 72 a plateau 74 is defined by the substrate 12'. The contacts 20', 22' for the plural photodetectors extend from the groove 72 and across the plateaus 74 much in the same way these features extended outwardly from the line of photodetectors 14 depicted in FIGS. 1–7. With the array 10' according to the embodiment of FIG. 8, when the layer 50' of Arsenic Selenide is applied on the surface 48' of the substrate over the photodetectors, contacts and traces, the upper surface 76 of the layer 50' replicates the groove 72 and plateaus 74. By selection of the size of groove 72 such that after the layer 50' is applied, a corresponding groove (not shown) is provided in the layer 50' and is sized to closely receive the fiber portion 50', positioning of the fiber portion over the photoconductors requires merely laying the fiber portion into the groove on the surface 76.

When the oven fusing operation is conducted on the embodiment of FIG. 8, Arsenic Selenide material from the layer 50' flows inwardly to joint with the fiber portion 50', as was explained above, and as indicated with the arrows 52'. Consequently, the lens 26' has a aplanatic hyperhemicylinder shape like the lens 26 of FIG. 3.

With the fiber portion 46 being made of Arsenic Selenide glass, the index of refraction "n" of the lens material 26 is 2.4. The maximum magnification possible with a single lens is equal to $n^2$. Thus, the maximum magnification or concentration of light which is possible with the lens 26 is 5.7. An actual experimental test of the invention according to the embodiment of FIGS. 1–6 which was fabricated using readily available equipment not specially adapted to the present invention achieved a gain factor of about four. Consequently, the advantages of the invention were well realized even with this experimental test apparatus.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

We claim:

1. A linear photoelectric array comprising:
   a plurality of photoelectric elements arranged along a line;
   and means for providing optical gain to said photoelectric elements, said gain providing means including an elongate unitary lens extending along and aligned optically to provide a linear area of focus coincident with said plurality of photoelectric elements along said line, wherein said array further includes a bonding layer overlying said photoelectric elements, and said lens is immersed in said bonding layer.

2. The linear photoelectric array of claim 1 wherein said lens and said bonding layer are made of the same material.

3. The linear photoelectric array of claim 1 wherein said lens includes a portion of said bonding layer.

4. The linear photoelectric array of claim 3 wherein said portion of said bonding layer is drawn from said layer immediately adjacent to said lens so that said bonding layer defines a valley on each side of said lens.

5. The linear photoelectric array of claim 1 further including means for aligning said lens with said line.

6. The linear photoelectric array of claim 5 wherein said alignment means includes a substrate which carries said photoelectric elements also defining a pair of transverse grooves, an alignment block slidably received in each one of said pair of transverse grooves, and each alignment block defining an alignment groove parallel with said line.

7. The linear photoelectric array of claim 5 wherein said alignment means includes a substrate which carries said photoelectric elements also defining a longitudinal groove in which said photoelectric elements are centrally located, said bonding layer replicating said substrate groove to define a respective groove, and said lens being received into said respective groove of said bonding layer.

8. The linear photoelectric array of claim 1 wherein said lens is of semicircular shape in cross section.

9. The linear photoelectric array of claim 1 wherein said lens is a aplanatic hyperhemicylinder shape in cross section.

10. The linear photoelectric array of claim 1 wherein said lens is made of a material selected from the group including Heavy Metal Fluoride Glasses, and Chalcogenide Glasses.

11. The linear photoelectric array of claim 10 wherein said lens is made of Arsenic Selenide glass.

12. The photoelectric array of claim 1 wherein said lens is an optical fiber.

13. The photoelectric array of claim 12 wherein said optical fiber is immersed in a transparent bonding layer interposed over said photoelectric elements.

14. The photoelectric array of claim 13 wherein said bonding layer and said lens are of the same material.

15. The photoelectric array of claim 14 wherein said lens includes a portion of said bonding layer.

16. A method of providing a linear photoelectric array with an improved performance resulting from optical gain, said method comprising the steps of:
forming on a surface of a substrate a plurality of photoelectric elements extending adjacent to one another along a straight line;
on said surface providing a transparent bonding layer of a selected material;
immersing an elongate unitary lens made of said selected material in said bonding layer along the line of said photoelectric elements, and
utilizing said elongate unitary lens to provide an elongate linear area of focus coincident with said plurality of photoelectric elements.

17. The method of claim 16 further including the step of adding to said lens a portion of said bonding layer.

18. The method of claim 16 further including the steps of configuring said lens to have a semicircular shape in cross section, and disposing said lens at a diametral or chordal surface thereof on said bonding layer.

19. The method of claim 18 further including the step of configuring said lens to have an aplanatic hyperhemicylingrical shape after addition thereto of said portion of said bonding layer.

20. The method of claim 16 further including the step of using a material selected from the group including Heavy Metal Fluoride Glasses, and Arsenic Selenide Glasses to make said lens.

21. The method of claim 20 including the step of using Arsenic Selenide as said bonding layer.

22. The method of claim 16 further including the steps of removing a segmental or semicircular portion of an elongate optical fiber, and using the remaining portion of said optical fiber to define said lens.

23. The method of claim 16 further including the step of aligning said lens with said line of photoelectric elements.

24. The method of claim 23 wherein said alignment step further includes the steps of providing a pair of transverse grooves on said substrate, providing a respective alignment block slidable in each of said pair of transverse grooves, defining an alignment groove in each of said alignment blocks into which said lens is closely receivable, and sliding said alignment blocks relative said substrate to align said lens with said line of photoelectric elements.

25. The method of claim 23 wherein said alignment step includes the step of providing a groove on said substrate parallel with said line and in which said photoelectric elements are centrally located, replicating with said bonding layer said substrate groove to define a respective groove in said bonding layer into which said lens is closely receivable, and disposing said lens into said groove of said bonding layer.

26. The method of claim 16 further including the step of heat fusing said lens and bonding layer.

27. The method of claim 26 wherein said heat fusing step includes disposing said array in an oven at a temperature of substantially 265° C. for an interval of about ten minutes.

28. A method of providing a linear photoelectric array having plural photoelectric elements arranged adjacent one another on a substrate along a line with an improved performance resulting from optical gain, said method including the steps of disposing a bonding layer on said substrate, disposing an optical fiber on said substrate in alignment with said plural photoelectric elements, and adding a portion of said bonding layer to said optical fiber to define a concentrating lens.

29. The method of claim 28 including selecting a material for said optical fiber and said bonding layer which will cooperatively by surface tension when softened with heat add said bonding layer portion to said optical fiber to define said lens.

* * * * *